United States Patent [19]
Fu et al.

[11] Patent Number: 5,426,066
[45] Date of Patent: Jun. 20, 1995

[54] LATE PROGRAMMING MASK ROM AND PROCESS FOR PRODUCING THE SAME

[75] Inventors: Chien-Chih Fu; Fong-Chun Lee; Nan-Chueh Wang; Shiao-Fen Pao, all of Hsinchu, Taiwan, Prov. of China

[73] Assignee: United Microelectronics Corp., Hsinchu City, Taiwan, Prov. of China

[21] Appl. No.: 298,338

[22] Filed: Aug. 30, 1994

Related U.S. Application Data

[62] Division of Ser. No. 149,847, Nov. 9, 1993.

[51] Int. Cl.6 .......................................... H01L 21/824.6
[52] U.S. Cl. .......................................... 437/52; 437/46; 437/48; 437/915
[58] Field of Search .................. 437/46, 48, 52, 60, 437/915; 257/329, 330

[56] References Cited

U.S. PATENT DOCUMENTS

| | | | |
|---|---|---|---|
| 5,096,845 | 3/1992 | Inoue | 437/915 |
| 5,208,172 | 5/1993 | Fitch et al. | 437/915 |
| 5,250,457 | 10/1993 | Dennison | 437/48 |
| 5,308,778 | 5/1994 | Fitch et al. | 437/915 |
| 5,330,924 | 7/1994 | Huang et al. | 437/48 |
| 5,358,887 | 10/1994 | Hong | 437/915 |

Primary Examiner—Tom Thomas
Attorney, Agent, or Firm—Ladas & Parry

[57] ABSTRACT

A late programming mask ROM integrated circuit and a process for producing the same. The mask ROM integrated circuit has a silicon substrate, and a plurality of memory cells formed on the silicon substrate. Each memory cell consists of a transistor element and a diode element electrically connected in series. Each transistor element has a drain layer, a channel layer, a source layer all stacked on the silicon substrate in a substantially vertical direction to form an upright drain/channel/source structure region, and a gate electrode region formed on the silicon substrate. The gate electrode regions and the upright drain/channel/source structure regions of the transistor elements are alternately arranged in an adjacent fashion along a substantially horizontal direction. Each diode element is formed by one upright drain/channel/source structure and a diode layer formed on or under the upright drain/channel/source structure.

15 Claims, 4 Drawing Sheets

LATE PROGRAMMING MASK ROM AND PROCESS FOR PRODUCING THE SAME

This is a divisional of co-pending application Ser. No. 08/149,847 filed Nov. 9, 1993.

BACKGROUND OF THE INVENTION

The present invention relates to a ROM (Read-Only Memory) cell structure, and more particularly to a late programming mask ROM integrated circuit (IC) having new memory cell structure, and a process for producing the same.

ROMs have been widely used in digital equipment, such as minicomputers and microcomputers, microprocessor systems, and the like, to store fixed programs and/or data for the systems. A ROM is a fixed-type or non-volatile memory device, and it is programmed during fabrication. In general, customers must send their programs and/or data to a ROM manufacturer before devices are manufactured. Then, the ROM manufacturer produces and delivers finished ROM ICs with desired programs and/or data permanently stored therein to the customer. The manufacturing process for ROM integrated circuits is very complicated and lengthy, and requires a large number of steps, with each step taking up much time and complicating material handling problems and inventory factors. Since most ROM devices are identical, except for the information stored or programmed therein, the ROM production process usually has two major phases. In a first phase, all processing steps till the step right before the programming step (which is near the end of entire ROM producing process) are performed. Then, the partially finished ROM devices are stockpiled to await program orders from customers. Upon receipt of an order, a program mask is prepared corresponding to a customer's program and/or data. In phase two, the programming step occurs, and the remaining process steps are then completed in a short period of time. In this manner, ROM ICs can be finished and delivered quickly after a customer places an orer. Thus, late programming mask ROM techniques are commonly used by ROM IC manufacturers.

At present, there are many methods which may be used to program ROM devices near the end of the device fabrication process. For example, the programming step can be completed by (1) ion implantation into the channel regions of selected transistor devices through their gate electrodes to alter their threshold voltages, or (2) leaving out selected contact openings in order not to provide electrical contacts to the selected memory cells, or (3) directly changing the metal pattern so as to bypass the selected memory cells. These programming methods, however, have their respective disadvantages.

Method (1) requires very high energy implantation to implant dopants through the gate oxide, typically relatively thick polysilicon gate electrode and through other films or layer which may exist on top of the polysilicon at this state. It is difficult to properly control the threshold voltages of the devices because (i) too high of an implant dose may adversely affect the breakdown voltage of adjacent junctions and (ii) unexpectedly thick gate electrodes may block the implant dose resulting in an insufficient change of the threshold voltage. Thus, Method (1) is difficult to control.

Method (2) requires a relatively large chip layout area because the ROM has to be so designed that each memory cell has its own contact opening, and contacts cannot be shared between cells. Similarly, Method (3) requires extra spaces on the chip because regular metal runs must be interrupted to make a detour and bypass the nonselected contacts. Methods (2) and (3) require that the ROM be unduly large in size.

SUMMARY OF THE INVENTION

The primary object of the present invention is to provide a late programming mask ROM integrated circuit having a upright transistor structure, which has much smaller cell size, and requires less implant energy during the late programming step.

Another object of the present invention is to provide a process for late programming a mask ROM to facilitate the programming of memory cells late in the fabrication process.

In accordance with the present invention, a late programming mask ROM integrated circuit comprises a silicon substrate, and a plurality of memory cells formed on the silicon substrate, each memory cell including a transistor element and a diode element electrically connected in series. Each transistor element has a drain layer, a channel layer, a source layer all stacked on the silicon substrate in a substantially vertical direction to form an upright drain/channel/source structure region, and a gate electrode region formed on the silicon substrate. The gate electrode regions and the upright drain/channel/source structure regions of the transistor elements are alternately arranged in an adjacent fashion along a substantially horizontal direction.

According to one aspect of the present invention, a process for producing a late programming mask ROM integrated circuit comprises the steps of providing a silicon substrate, and forming a plurality of memory cells on the silicon substrate. Each formed memory cell includes a transistor element and a diode element electrically connected in series. Each transistor element has a drain layer, a channel layer, a source layer all stacked on the silicon substrate in a substantially vertical direction to form a upright drain/channel/source structure region. A gate electrode region is formed on the silicon substrate. The gate electrode regions and the upright drain/channel/source structure regions of the transistor elements are alternately arranged in an adjacent fashion along a substantially horizontal direction.

According to another aspect of the present invention, each upright drain/channel/source structure region provides, at its two opposite sides, drain/channel/source structures for two transistor elements, which are respectively controlled by two adjacent gate electrodes. The mask ROM integrated circuit further comprises a plurality of diode layers formed on or under the upright drain/channel/source structure regions, and the diode elements are formed in combination with the upright drain/channel/source structure regions.

According to yet another aspect of the present invention, the mask ROM integrated circuit can be programmed by implanting a dopant into the channel layers of designated memory cells or by etching to remove part of the gate electrode regions of designated memory cells. The mask ROM integrated circuit may further comprises a passivation layer formed over the gate electrode regions and the drain/channel/source structure regions, and a plurality of pad openings formed in designated regions.

According to further aspect of the present invention, a process for producing a late programming mask ROM integrated circuit comprises the steps of:

providing a silicon substrate having isolation regions and active regions alternately and adjacently arranged;

deposition of a drain layer on the silicon substrate;

implanting ions into the drain layer to form designated drain regions;

deposition of a channel layer on the drain layer;

deposition of a source layer on the channel layer;

patterning the source, channel, and drain layers by lithography and etching to form a plurality of separated upright drain/channel/source structures;

forming a gate oxide over the silicon substrate and the upright drain/channel/source structures; and forming a plurality of gate electrode structures, each within the space between two adjacent drain/channel/source structures.

According to yet further aspect of the present invention, the process further comprises the step of forming a diode layer on each drain/channel/source structure to construct a plurality of diode structures in combination with the drain/channel/source structures.

BRIEF DESCRIPTION OF THE DRAWINGS

The present invention can be more fully understood by reference to the following description and accompanying drawings, which form an integral part of this patent:

FIG. 4b is a cross-sectional view of the embodiment of integrated circuit shown by FIGS. 1a-1d, 2a-2d, and 3a-3d, illustrating the same ion implantation programming method shown by FIG. 4a;

FIG. 7b is an electrical circuit schematic diagram of ROM integrated circuit by FIG. 7a.

DETAILED DESCRIPTION OF THE PREFERRED EMBODIMENTS

According to the present invention, an upright thin-film transistor structure is utilized to form the basic ROM cell, so that the cell size is minimized, and the code programming is easily accomplished. For easy understanding the present invention, a process for fabricating a mask ROM integrated circuit and the formed cell transistor structure, according to one preferred embodiment of the present invention, are described in detail hereinafter.

Figure 3A:
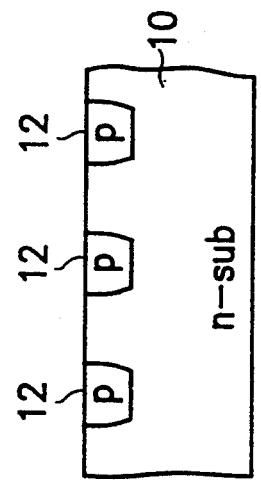
FIGS. 3a through 3d schematically show, in side cross section view, the process correspondingly shown by FIGS. 1a through 1d.
Figure 2A:
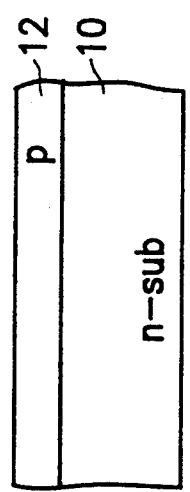
FIGS. 2a through 2d schematically show, in frontal cross sectional views, the process corresondingly shown by FIGS. 1a through 1d.
Figure 1A:
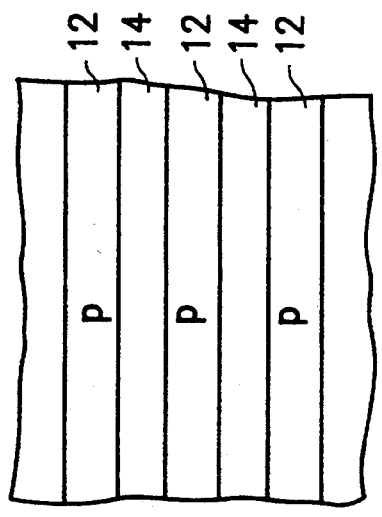
FIGS. 1a through 1d schematically show, in plan views, one preferred embodiment of the process for fabricating a late programming mask ROM integrated circuit of the present invention.

Referring now to FIGS. 1a through 1d, 2a through 2d, and 3a through 3d, FIGS. 1a through 1d schematically show, in plan view, the process for fabricating the mask ROM integrated circuit of the present invention. FIGS. 2a through 2d are frontal cross-sectional views corresponding to the plan views of FIGS. 1a through 1d, and FIGS. 3a through 3d are side cross-sectional views corresonding to the plan views of FIGS. 1a through 1d. A semiconductor substrate, for example an $n^-$ substrate 10, forms the basis of the structure. A block out mask of resist material (not shown) is formed over designated isolation regions 14 so as to expose the designated active regions 12. This mask is made by conventional lithography and etching techniques commonly used in the art. P-type ions are implanted to form the active regions 12, and then the resist mask is removed. The isolation regions 14 are formed alternately between the active regions 12, as shown in FIG. 1a. Alternatively, the isolation regions may be formed by growing field oxide regions. So far, the formed structure is shown in FIGS. 1a, 2a, and 3a.

Figure 3B:
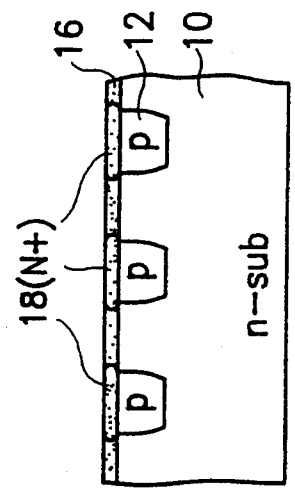
Figure 2B:
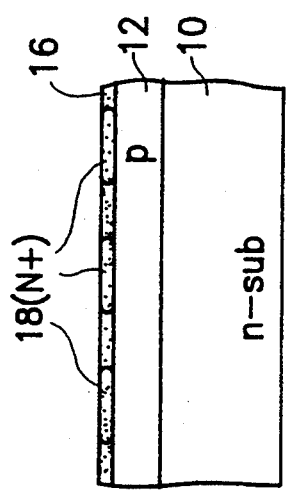
Figure 1B:
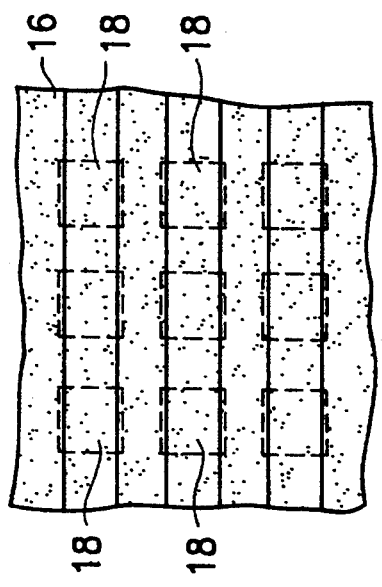

Referring particularly to FIGS. 1b, 2b, and 3b, a P-type polysilicon thin film 16 is formed by deposition over the entire substrate 10, and another block out mask of resist material (not shown) is formed and lithography and etching are used to expose the designated drain regions 18 of cell transistor devices on the active regions 12. $N^+$ ions are now implated to form the drain regions 18 in the polysilicon thin film 16, and then the resist mask is removed.

Figure 2C:
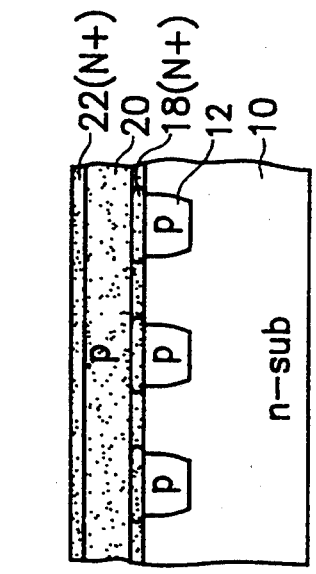
Figure 2E:
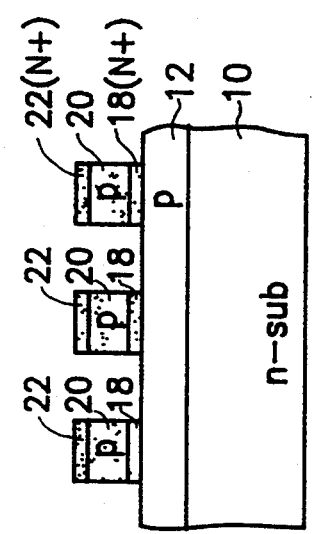
Figure 1C:
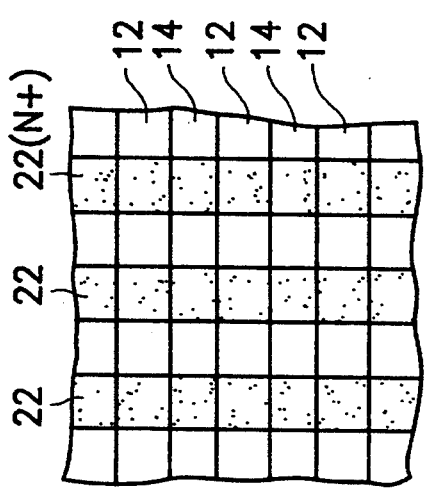
Figure 3C:
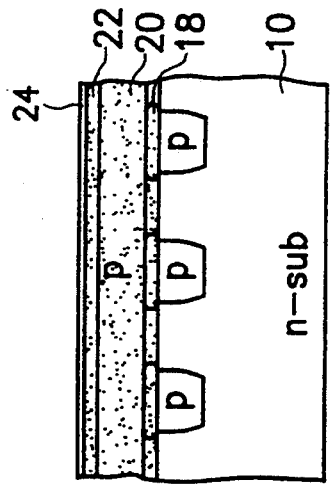

Referring to FIGS. 1c, 2c, and 3c, a P-type polysilicon channel layer 20 is deposited on the thin film 16, and then an $N^+$ polysilicon source layer 22 is deposited on the channel layer 20. The source layer 22, channel layer 20, and thin film 16 are patterned by conventional lithography and anisotropic etching techniques to form upright drain/channel/source (18/20/22) structures as shown especially in FIG. 2c. Adjacent drain/channel/source structures are separated by a distance as shown in FIGS. 1c and 2c.

Figure 3D:
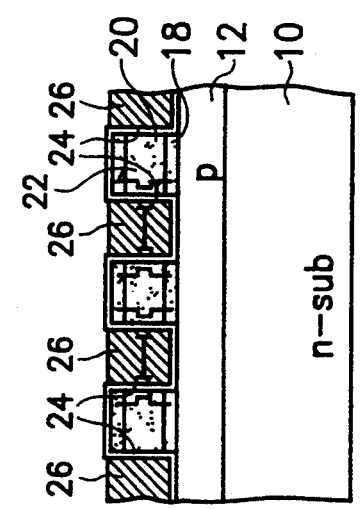
Figure 1D:
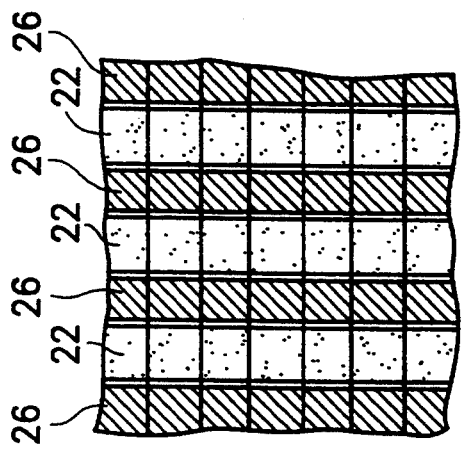

Referring to FIGS. 1d, 2d, and 3d, a layer of gate oxide 24 is grown on the entire exposed surface of the ROM structure formed so far. A polysilicon gate layer 26 is deposited over the gate oxide layer 24, and is etched back by conventional lithography and etching techniques to form polysilicon gate electrodes 26, as shown in FIGS. 1d and 2d. The polysilicon gate electrodes 26 are formed alternately between the upright drain/channel/source structures 18/20/22. FIG. 2d includes transistor symbols to clearly show the vertical or upright transistor structure formed by this preferred embodiment. As clearly shown in FIG. 2d, each side of the upright drain/channel/source structures 18/20/22 forms the drain electrode, channel, and source electrode of a MOS FET device. Each gate electrode 26 formed in the space between two adjacent drain/channel/source structures 18/20/22 is a common gate electrode for two transistors. The upright transistor structure of the present invention effectively utilizes the available space to minimize cell size. The ROM integrated circuits finished by this process can be treated as unfinished products, and can be stockpiled to wait for program orders from customers.

Figure 4A:
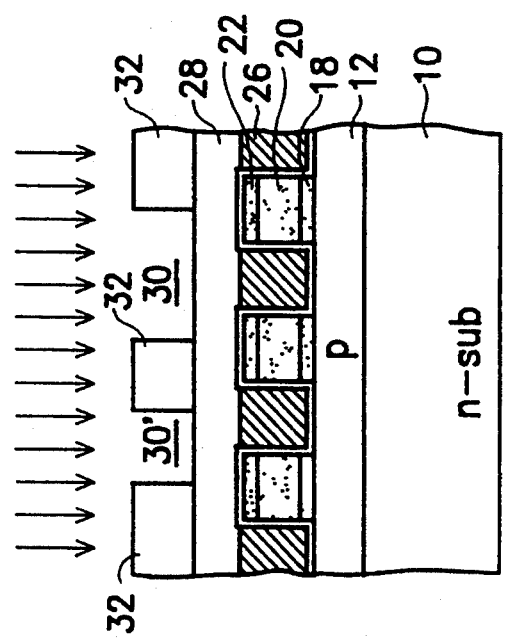
FIG. 4a is a plan view of the embodiment of integrated circuit shown by FIGS. 1a-1d, 2a-2d, and 3a-3d, illustrating an ion implantation programming method for late programming mask ROM of the present invention.
Figure 4B:
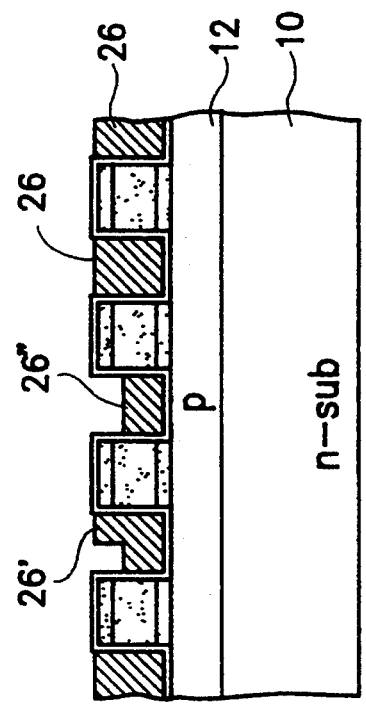

In another preferred embodiment of the present invention, conventional passivation and pad opening procedures may be also used to form unfinished ROM products which are stockpiled, waiting for program orders. According to the present invention, there are two kinds of code programming methods: (1) the ion implantation programming method and (2) a metal etching programming method. Referring to FIGS. 4a and 4b, the ion implantation programming method can be applied to the above unfinished ROM products with or without passivation and pad openings. The ROM structure shown in FIG. 4b includes a passivation 28, and the cell transistors underlying windows 30 and 30' in FIG. 4a, for example, are planned to be turned off permanently by implanting proper dopants, i.e. to be programmed or coded. As shown in FIG. 4b, a code mask 32 of resist material is formed and imaged, according to customer's program using convention photolithography techniques, to expose the cell transistors which are intended to be programmed. The large window 30 exposes two underlying cell transistors to be programmed, and the small window 30' exposes one underlying cell transistor to be programmed. According to the above preferred embodiment, P-type dopants, for example Boron ions ($B^{11}$), are introduced into the channel regions 20 to turn off the transistors under the windows 30, 30'.

Figure 5:
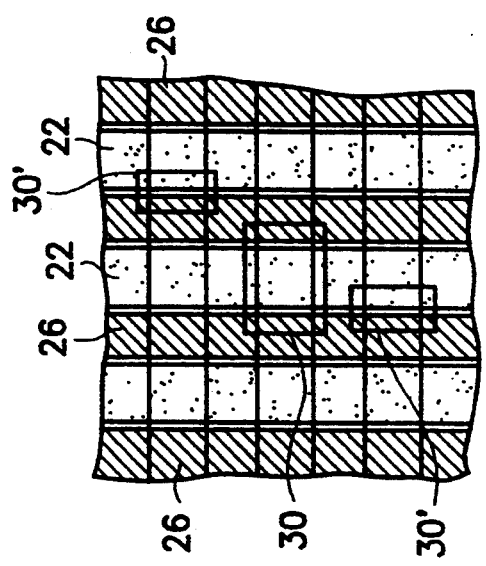
FIG. 5 is a cross-sectional view of the embodiment of integrated circuit shown by FIGS. 1a-1d, 2a-2d, and 3a-3d, illustrating a metal etching programming method for late programming mask ROM of the present invention.

The metal etching programming method of the present invention can be only applied to the above unfinished ROM products without passivation. As shown in FIG. 5, a part of the left side of polysilicon gate electrode 26' is etched out by means of a code mask (not shown), which is produced according to customer's program and is similar to the code mask 32 of FIG. 4b, and further by means of conventional etching techniques. In this way, the polysilicon gate electrode 26' can no longer turn on the left-hand cell transistor while still can turn on the right-hand cell transistor, so that a selectively coding procedure is achieved. The upper part of polysilicon gate electrode 26'' is etched out so that its left-hand and right-hand cell transistors are both turned off permanently.

Figure 6:
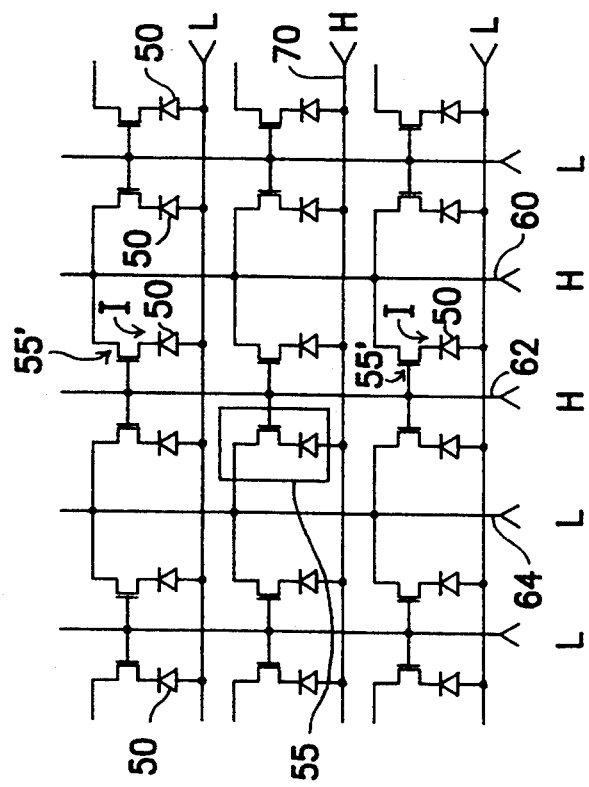
FIG. 6 is an electrical circuit schematic diagram of ROM integrated circuit shown by FIGS. 1a-1d, 2a-2d, and 3a-3d.

The late programming mask ROM integrated circuit architecture of the above-described embodiment of the present invention provides a ROM device consisting of a plurality of memory cells, parts of which are shown in FIG. 6. One memory cell includes a transistor 51 and a diode 50 connected in series with each other. The diodes 50 are formed by the N+ drain regions 18 and the P-type active regions 12, as shown in FIG. 2d, and their purposes will be further described below. Suppose that data in the cell indicated by block 55 is to be read out. The reading procedure is: bit lines 60 and 62 are connected to high voltage while other bit lines to low voltage; and word line 70 is connected to high voltage while other word lines to low voltage. In this manner, only the cell 55 is sensed. If the cell 55 was coded and cannot be turned on, the bit line 64 stays at its low voltage level. If the cell 55 was not coded, a high voltage level can be sensed on the bit line 64. The purpose of the diodes 55 is to hinder undesired current flow. That is to say, the current of cell transistor can only flow in one predetermined direction. In reading the cell 55, for example, if there were no diodes 50, a current indicated by arrows I would flow through the cells 55' at the upper-right and lower-right positions of the cell 55, resulting in signal errors. Thus, the diodes 50 are used to inhibit current flow in this direction.

Figure 7A:
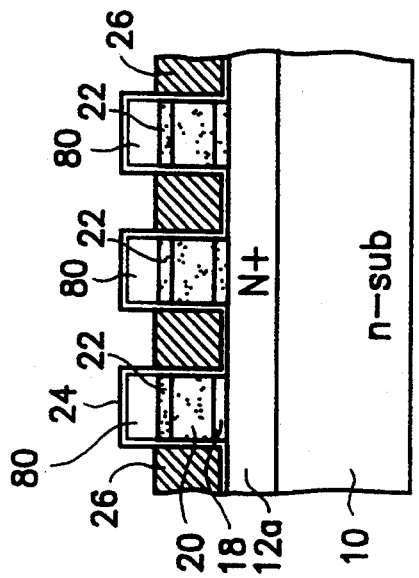
FIG. 7a is a cross-sectional view of a late programming mask ROM integrated circuit according to another preferred embodiment of the present invention.
Figure 7B:
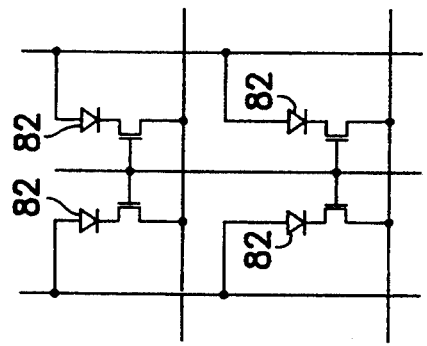

According to another preferred embodiment of the present invention, a different late programming mask ROM integrated circuit architecture is shown in FIG. 7a. This embodiment is very similar to the architecture of FIG. 2d, and there are only two differences between them. First, the active regions 12a of this embodiment are formed by implantation using an N+ dopant, not a P-type dopant. Second, P-type diode regions 80 are formed on the source regions 22 before oxidation growth of the gate oxide layer 24, and combination of the diode regions 80 and source regions 22 form the diodes 82 shown in FIG. 7b. The ROM architecture of this preferred embodiment constructs a ROM circuit consisting of a plurality of memory cells, parts of which are shown in FIG. 7b. Similarly, each memory cell includes a transistor and a diode connected in series. The reading technique for this ROM circuit is a little different from that of the ROM circuit described with reference to FIG. 6, but it can be easily derived by those skilled in the art from above detailed description of the present invention. Therefore, it is deemed unnecessary to be further described.

The advantages of the ROM of the present invention are summarized as follows:

1. The late programming advantage, e.g. after-metal or after-passivation programming, is obtained. The programming techniques are simpler than those of the prior art.

2. The special upright transistor arrangement results in spaces between adjacent drain/channel/source structures being effectively utilized by providing polysilicon gate electrodes therein. Both the cell size and the cost of the resulting device are significantly reduced.

3. The chip processing techniques used in the present invention are compatible with current silicon chip processing techniques.

4. The channel length of cell transistors, which depends on the thickness of deposited polysilicon channel layer 20 and the N+ source/drain doping depth, can be made to 0.2 $\mu$m or even shorter to obtain larger cell transistor current.

5. According to the special upright transistor arrangement of the present invention, the ion implantation energy which is used in code programming is lower than that used in the prior art because it is unnecessary to implant through a thick polysilicon gate electrode.

It should be understood that the above-described materials, dopants, and their conductivity types are all examples for clearly showing the spirit and principle of the present invention, and can be altered by those skilled in the art depending upon the patent application. It should be also understood that after the code programming step, a final series of steps involve the deposition of passivation (in the case of after-metal programming ROM architecture) and a metallurgy layer to electrically contact the elements of the ROM and connect these elements to form the desired circuit on the integrated circuit chip. These steps are done by conventional deposition, lithography, and etching techniques that are well understood by those skilled in the art.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for producing a late programming mask ROM integrated circuit comprising the following steps of:
   (a) providing a silicon substrate; and
   (b) forming a plurality of memory cells on said silicon substrate, each formed memory cell including a transistor element and a diode element electrically connected in series, each transistor element having a drain layer, a channel layer, a source layer all stacked on said silicon substrate in a substantially vertical direction to form a upright drain/channel/source structure region, and a gate electrode region formed on said silicon substrate; said gate electrode regions and said upright drain/channel/source structure regions of said transistor elements being alternately arranged in an adjacent fashion along a substantially horizontal direction.

2. The process as claimed in claim 1, wherein each upright drain/channel/source structure region provides, at two opposite sides, drain/channel/source structures for two transistor elements, which are respectively controlled by two adjacent gate electrodes.

3. The process as claimed in claim 2, between the steps (a) and (b), further comprising the step of forming a plurality of diode layers in said silicon substrate, and wherein in step (b), said upright drain/channel/source structure regions are formed on designated regions of said diode layers, whereby said diode layers provide said diode elements in combination with said upright drain/channel/source structure regions.

4. The process as claimed in claim 3, further comprising the step of ion implantation of a dopant into the channel layers of designated memory cells when said ROM integrated circuit is programmed.

5. The process as claimed in claim 4, further comprising the steps of forming a passivation layer over said gate electrode regions and said drain/channel/source structure regions, and forming a plurality of pad openings in designated regions, before the ion implantation step.

6. The process as claimed in claim 3, further comprising the step of etching to remove at least part of the gate electrode regions of designated memory cells when said ROM integrated circuit is programmed.

7. The process as claimed in claim 2, further comprising the step of forming a plurality of diode layers on said upright drain/channel/source structure regions to provide said diode elements in combination with said upright drain/channel/source structure regions.

8. The process as claimed in claim 7, further comprising the step of ion implantation of a dopant into the channel layers of designated memory cells when said ROM integrated circut is programmed.

9. The process as claimed in claim 8, further comprising the steps of forming a passivation layer over said gate electrode regions and said diode layers, and forming a plurality of pad openings in designated regions, before the ion implantation programming step.

10. The process as claimed in claim 7, further comprising the step of etching to remove at least part of the gate electrode regions of designated memory cells when said ROM integrated circuit is programmed.

11. A process for producing a ROM integrated circuit comprising the steps of:
   (a) providing a silicon substrate having isolation regions and active regions alternately and adjacently arranged;
   (b) deposition of a drain layer on said silicon substrate;
   (c) implanting ions into said drain layer to form designated drain regions;
   (d) deposition of a channel layer on said drain layer;
   (e) deposition of a source layer on said channel layer;
   (f) patterning said source, channel, and drain layers by lithography and etching to form a plurality of separated upright drain/channel/source structures;
   (g) forming a gate oxide over said silicon substrate and said upright drain/channel/source structures; and
   (h) forming a plurality of gate electrode structures, each within the space between two adjacent drain/channel/source structures.

12. The process as claimed in claim 11, when said formed late programming mask ROM integrated circuit is to be programmed, further comprising the following step of:
   (i) implanting ions into designated channel regions.

13. The process as claimed in claim 12, before the step (i), further comprising the steps of:
   deposition of a passivation layer over entire formed structure; and
   forming a plurality of pad openings in designated regions.

14. The process as claimed in claim 11, when said formed late programming mask ROM integrated circuit is to be programmed, further comprising the step of etching to remove part of designated gate electrodes.

15. The process as claimed in claim 11, between the steps (f) and (g), further comprising the step of forming a diode layer on each drain/channel/source structure to construct a plurality of diode structures in combination with said drain/channel/source structures.

* * * * *